March 24, 1970 F. J. HIERHOLZER, JR 3,502,952

PLANAR PNPN SWITCHING DEVICE

Original Filed Oct. 18, 1965 3 Sheets-Sheet 1

INVENTOR.
FRANK J. HIERHOLZER, JR.
BY
Shenier & O'Connor
ATTORNEYS

March 24, 1970 F. J. HIERHOLZER, JR 3,502,952

PLANAR PNPN SWITCHING DEVICE

Original Filed Oct. 18, 1965 3 Sheets-Sheet 2

INVENTOR.
FRANK J. HIERHOLZER, JR.
BY
Shenier & O'Connor
ATTORNEYS

PLANAR PNPN SWITCHING DEVICE

Original Filed Oct. 18, 1965 3 Sheets-Sheet 3

INVENTOR.
FRANK J. HIERHOLZER, JR.
BY
Shenier & O'Connor
ATTORNEYS

United States Patent Office
3,502,952
Patented Mar. 24, 1970

3,502,952
PLANAR PNPN SWITCHING DEVICE

Frank J. Hierholzer, Jr., New Hartford, N.Y., assignor to United Aircraft Corporation, East Hartford, Conn., a corporation of Delaware Continuation of application Ser. No. 496,798, Oct. 18, 1965. This application May 29, 1968, Ser. No. 734,174
Int. Cl. H01l *11/00, 7/00*
U.S. Cl. 317—235 2 Claims

ABSTRACT OF THE DISCLOSURE

A planar PNPN gated switching device in which of two closely spaced regions of material of one conductivity type in a substrate of the opposite conductivity type has a third region of the opposite conductivity type therein with all regions accessible at a surface of the substrate so that the device apparently comprises a diode and a transistor with the substrate constituting one of the diode elements and the transistor collector. Means establishes such a potential between the first and third regions as tends to produce forward conduction through the diode and second means applies a potential to the second region of such polarity as tends to render the transistor conductive to gate the device from a high resistance state to a low resistance state whereby the device has a characteristic analogous to that of a screen grid thyratron.

This application is a continuation of my copending application, Ser. No. 496,798, filed Oct. 18, 1865.

My invention relates to a PNPN structure and more particularly to an improved PNPN structure in which all of the contacts can be made from one side of the structure.

PNPN structures are finding increasingly wide use. In the prior art, these structures comprise a pair of relatively thin layers of p-type conductivity and n-type conductivity material sandwiched between relatively heavier layers of p-type material and n-type material with all layers accessible. It will readily be apparent that in such a device all of the contacts cannot be made from the same side of the device but they must be made at various points thereon. Moreover, these four-layer structures do not readily lend themselves to manufacture by diffusion techniques owing to the fact that, in accordance with the prior art, three successive diffusions into a substrate are required to produce such a structure.

I have invented a planar PNPN structure which overcomes the disadvantages of four-layer PNPN structures of the type known in the prior art. My device is so constructed that all of the contacts can be made from one side of the device. It readily lends itself to manufacture by diffusion techniques. It is extremely simple in structure and relatively inexpensive as compared to four-layer structures of the type known in the prior art. Owing to the fact that all of the contacts can be made from one side of the device, it readily lends itself to incorporation into an integrated circuit.

One object of my invention is to provide a PNPN structure which is planar in nature.

Another object of my invention is to provide an improved PNPN structure wherein all contacts can be made at one surface of the structure.

A further object of my invention is to provide a PNPN structure which can be made by diffusion processes.

A still further object of my invention is to provide a PNPN structure which readily lends itself to incorporation in integrated circuits.

Other and further objects of my invention will appear from the following description.

In general my invention contemplates the provision of a planar PNPN structure and method of constructing the same in which I form distinct first and second regions of material of one conductivity type in a planar body of semiconductive material of the opposite conductivity type with the regions extending to one surface of the planar body, thus forming respective first and second junctions between the regions and the body. I then form a third region of material of the opposite conductivity type inside of the first region and extending from the body surface to within a predetermined distance of the lower boundary of the first region, thus forming a third junction. I apply a cathode ohmic contact to the third region at the surface of the body, an anode ohmic contact to the second region at the surface of the body, and a gate contact to the first region outside the third region and at the surface of the body. I may apply a turn-off ohmic contact to the body at the surface thereof outside the first and second regions.

In the accompanying drawings which form part of the instant specification and which are to be read in conjunction therewith and in which like reference numerals are used to indicate like parts in the various views.

Figure 1:
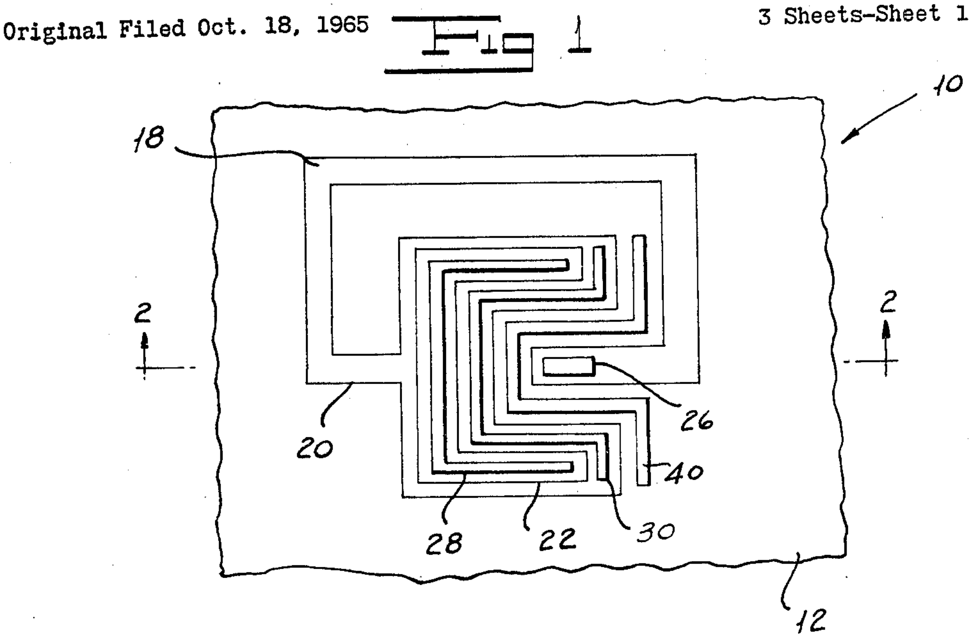
FIGURE 1 is a plan view of one form of my planar PNPN structure.
Figure 2:
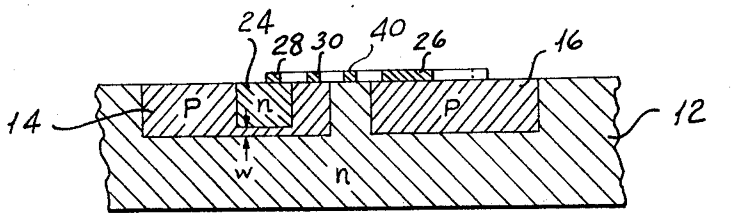
FIGURE 2 is a sectional view of the form of my planar PNPN structure shown in FIGURE 1 taken along the line 2—2 of FIGURE 1.
Figure 3:
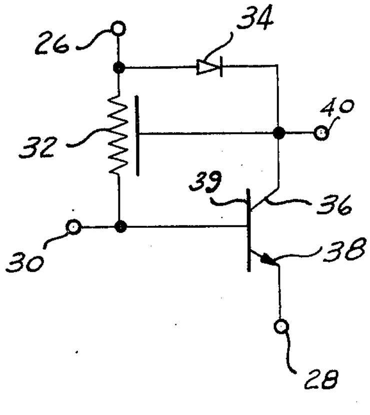
FIGURE 3 is a schematic view of an apparent equivalent circuit of the form of my structure shown in FIGURES 1 and 2.

Referring now to FIGURES 1 to 3 of the drawings, I have shown a form of my planar PNPN structure indicated generally by the reference character 10 including a planar body or substrate 12 of a suitable n-conductivity type material such, for example, as a silicon wafer. I first form an oxide mask of a suitable configuration on the surface of the wafer 12 and diffuse a suitable impurity or dopant into the wafer from the upper surface thereof to form respective regions 14 and 16 of p-type conductivity. These regions 14 and 16 are connected by an elongated area 18 of p-type material shown in FIGURE 1. The over-all diffusion to produce the regions 14 and 16 and the connecting length 18 is defined by the line 20 in FIGURE 1.

The doping operation for producing the p-conductivity type regions may be accomplished by any suitable techniques known in the art. For example, the surface of the substrate 12 can be provided with an oxide film which is then etched to form a mask having an opening in the shape of the area bounded by the line 20. When this negative mask has been made as by a photoresist technique, the dopant is diffused into the exposed area to form the p-type regions 14 and 16 and the connecting length 18. Any suitable impurity, such as boron, aluminum, gallium, yttrium or thallium may be vacuum sealed together with the wafers in a tube to produce the diffusion or it may be achieved by any other method known to the art.

After having performed the p-type producing diffusion in the manner described above, I form a new oxide mask on the surface of the wafer and photoetch it to expose an area bounded by the line 22 in FIGURE 1. Through the new mask I diffuse an impurity such as will produce an n-conductivity type region 24 in the body 12 over the area bounded by the line 22. It will readily be apparent that the area defined by line 22 is entirely within the area defined by the line 20 so that the n-type region 24 is entirely within the p-type region 14. Since the extent of the diffusion of the impurity which forms the region 24 is dependent solely upon time, I may closely control the distance W between the bottom of the region 24 and the bottom of the region 14 to leave an extremely thin amount of p-type material therein. Any suitable type impurity which will produce an n-conductivity type region may be employed to form the region 24. For example, I may use an element such as phosphorus arsenic selected from Group V of the Periodic Table.

Having performed the diffusions described above. I next form ohmic contacts on various portions of the surface of the doped wafer 12. This may be accomplished by again forming a mask in the negative of the areas to which the contacts are to be applied and then vapor-depositing a conductive material such as aluminum or silver or the like through the mask. Specifically, in the form of my PNPN device illustrated in FIGURES 1 and 2, I form an anode contact 26 at the surface of the region 16, a cathode contact 28 at the surface of the body 12 on the region 24 and a gate contact 30 at the surface of the body over the region 14 outside the region 24. With these contacts made I have provided a device wherein the current flow from the anode contact 26 to the cathode contact 28 is controlled by the potential applied to the gate contact 30. More particularly, the device constitutes a PNPN diode which has a characteristic which is analogous to that of a screen grid thyratron. With the positive potential at the anode contact 26 and with the cathode contact 28 at ground, the junction between the material of the region 14 and the substrate 12 acts as a reverse-biased diode. When a positive potential is applied to the gate contact 30, this junction between region 14 and substrate 12 becomes conductive and a very large current flows. Explained in another way, with increasing voltage across the contacts 26 and 28, normally the breakover voltage of the device will not be reached in the absence of an input at the gate. However, a current at the gate contact 30 of a predetermined value turns the device on and control is lost.

Referring to FIGURE 3 I have shown the apparent equivalent circuit of the device shown in FIGURES 1 and 2. For purposes of clarity I have indicated the terminals of this circuit by the same reference characters as are used to indicate the contacts in FIGURES 1 and 2. As shown therein, the length 18 forms a resistor 32 between terminals 26 and 30; the junction between the region 16 of material and the substrate 12 is represented as a diode 34; the junction between the substrate and the region 14 is represented by a collector 36; and the junction between the material of the region 14 and the material of the region 24 is represented as an emitter 38 while the portion of the material of region 14 to which contact 30 is applied is represented as a base 39.

I may apply a shutoff contact 40 to the portion of the substrate 12 extending to the surface of the body 12 between the regions 14 and 16 to permit a potential to be applied thereto to turn the device off once it has been turned on by the application of a gating current to the contact 30.

Figure 4:
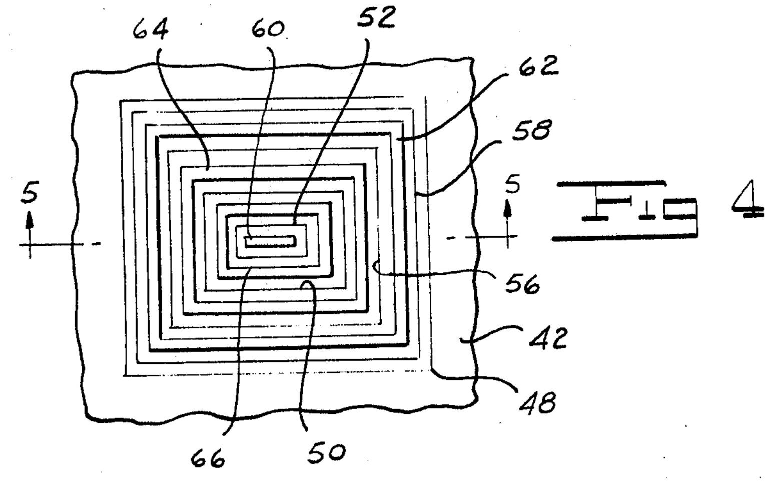
FIGURE 4 is a plan view of an alternate form of my planar PNPN structure.
Figure 5:
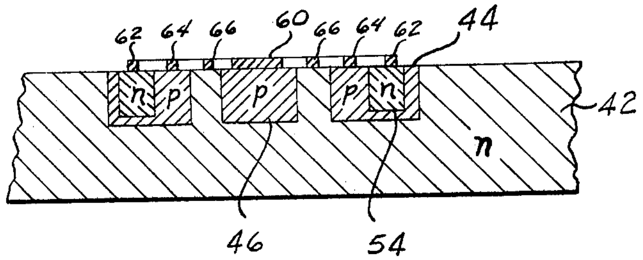
FIGURE 5 is a sectional view of the form of my PNPN structure shown in FIGURE 4 taken along the line 5—5 of FIGURE 4.
Figure 6:
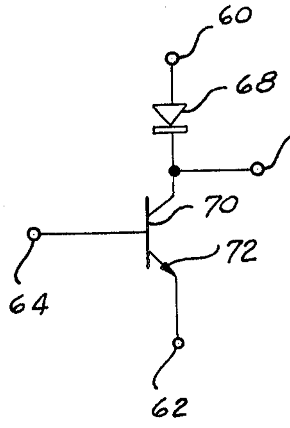
FIGURE 6 is a schematic view of the apparent equivalent circuit of the form of my PNPN structure shown in FIGURES 3 and 4.

Referring now to FIGURES 4 to 6, I have shown a modified form of my PNPN device in which I first diffuse p-type conductivity material into a substrate 42 to form a generally rectangular region 44 surrounding an exposed surface area of the substrate. Concomitantly with formation of the region 44 I diffuse a second region 46 of p-type conductivity material surrounded by and spaced from the area 44. The region 44 extends to the surface of the body 42 and is defined at that surface by the area between the lines 48 and 50 shown in FIGURE 4. The region 46 likewise extends to the surface and has an area bounded by the line 52 in FIGURE 4. Having performed the p-type diffusion, I next diffuse an n-type impurity into the region 44 in a generally rectangular region 54 which extends to the surface of the body 42 and which is defined at that surface by the area between lines 56 and 58. Following the n-type diffusion I apply an anode contact 60 to the region 46 at the surface of the body 42, a cathode contact 62 to the region 54 at the surface of the body 42, and a gating contact 64 to the region 44 outside the region 54 at the surface of the body 42. I may also apply a shutoff contact 66 to the substrate 42 on the surface thereof between regions 46 and 44.

As shown in FIGURE 6, the apparent equivalent circuit of the device shown in FIGURES 4 and 5 is a diode 68 representing the junction between region 46 and the substrate 42 and a collector junction 70 representing the junction between the region 44 and the substrate, and an emitter junction 72 representing the junction between the region 44 and the region 54.

Figure 7:
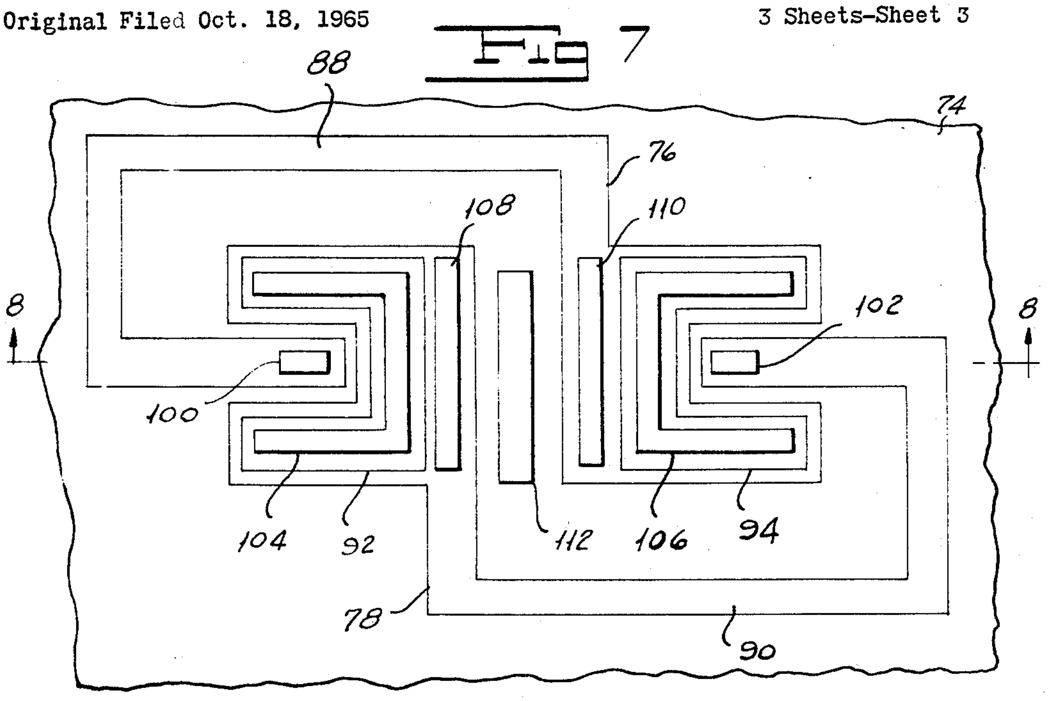
FIGURE 7 is a plan view of an integrated amplifier output circuit incorporating my planar PNPN structure.
Figures 8, 9:
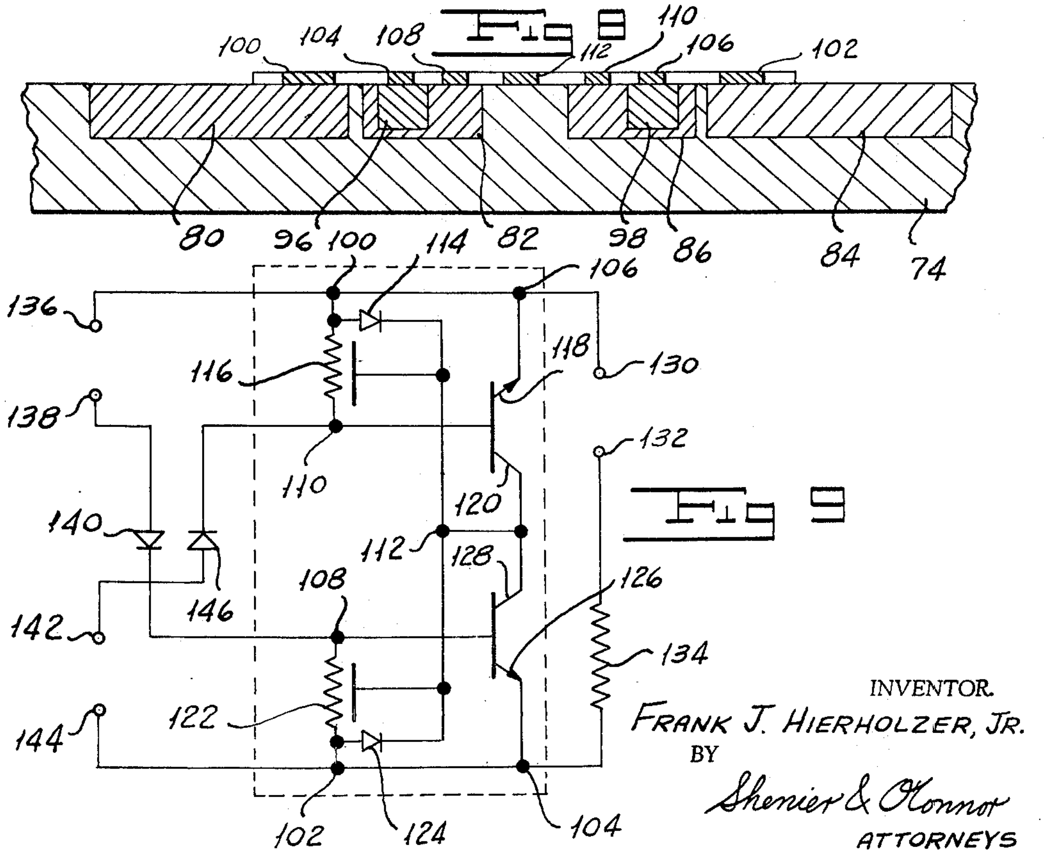
FIGURE 8 is a sectional view of the integrated circuit shown in FIGURE 7 taken along the line 8—8 of FIGURE 7.
FIGURE 9 is a schematic view of an amplifier incorporating the apparent equivalent circuit of the integrated output circuit of FIGURES 7 and 8.

Referring now to FIGURES 7 to 9, my PNPN structure has particular utility when applied to the output of a power amplifier. In this application I first diffuse p-type impurity into a substrate 74 through a mask having openings in the shape of the two areas shown in FIGURE 7 as bounded by the lines 76 and 78. This operation forms a pair of distinct p-type regions 80 and 82 and another pair of distinct regions 84 and 86, as well as a first resistive length 88 joining regions 80 and 86 and a second resistive length 90 joining regions 82 and 84.

After having performed the p-type impurity into the areas 82 and 86 through a mask having respective openings in the shape of the areas bounded by the lines 92 and 94 in FIGURE 7. This results in the formation of regions 96 and 98 of n-type material in the regions 82 and 86. Next, I apply ohmic contacts in a manner analogous to that described hereinabove in connection with FIGURES 1 through 6. Contacts 100 and 102 are applied to the respective regions 80 and 84; contacts 104 and 106 are applied to the regions 96 and 98; and contacts 108 and 110 are applied to the regions 82 and 86 outside the regions 96 and 98. If it is desirable to ground a point in the circuit for a reason to be described, I may apply a contact 112 to an exposed surface portion of the substrate between the regions 82 and 86.

In order to make clear the analogy of the circuit shown in FIGURE 9 to the structure illustrated in FIGURES 7 and 8, I have applied reference characters to points in FIGURE 9 corresponding to the contacts in FIGURES 7 and 8. From the common reference characters it will readily be appreicated that the junction between the region 80 and the substrate 74 can be represented as a diode 114 while length 88 is represented as a resistor 116. Similarly, the junction between the region 98 and the region 86 is represented as an emitter 118 while the junction between the region 86 and the substrate is represented as a collector 120. From this explanation the analogy of the resistor 122, the diode 124, the emitter 126 and the collector 128 shown in FIGURE 9 will be apparent. In the circuit shown in FIGURE 9 I have indicated an alternating current source having terminals 130 and 132 and a resistive load 134 as being connected across terminals 104 and 106. Terminals 136 and 138 connected, respectively, to contact 100 and to a diode 140 connected to contact 108 perimt the application of a first input to the circuit. Other terminals 142 and 144 connected respectively to a diode 146 connected to contact 110 and to contact 102 perimt the application of a second input to the circuit.

With a resistive load 134 the load current and load voltage are in phase. If contact 106 is positive, the unit including the collector 128 and emitter 126 blocks the flow of load current until a pulse of base current turns the unit on. When that occurs load current flows for the remainder of the half cycle. The diode 114 associated with resistor 116 shunts load current by the unit including emitter 118 and collector 120. On the other half cycle, that unit functions in a similar manner. It will be seen that the diodes 114 and 124 perform both an injection function and a protective function. The contact 112 is not necessary in this circuit unless ground contact at that point is required.

In my process of making the form of my PNPN device shown in FIGURE 1, I first mask the substrate 12 with an oxide coating having an opening in the shape of the region enclosed by line 20 in FIGURE 1 and diffuse a p-type impurity into the substrate through the mask. When this has been done, I form a new mask with an opening having the shape of that area bounded by line 22 in FIGURE 1 and diffuse an n-type impurity through the mask. In carrying out the second diffusion, I time it to provide a very thin layer of material between the bottom of the n-type diffusion and the bottom of the previously performed p-type diffusion. That is, the thickness W of this material indicated in FIGURE 2 is extremely small. At the same time if an ohmic contact to the n-type substrate 42 is desired, the space between the regions 14 and 16, while being relatively narrow, may be made sufficiently wide to permit the application of a contact thereto.

Having performed the diffusions described above, I have provided a pair of distinct regions 14 and 16 of one conductivity type material in the substrate with a third region 24 of material of the same type as the substrate within the region 14. I then apply contacts 26 and 28 to the respective regions 16 and 24 to permit the application of a potential across these two areas. With the application of that potential it will be apparent that one of the junctions of the device, such as the junction between the substrate 12 and the region 14 in the particular structure under consideration, will be reverse-biased. Then I apply a contact 30 to the surface of the region 14 to permit the control of current through the contact 30 so as to cause an appreciate current flow across the junction between substrate 12 and region 14. If desired, I may apply a contact 40 to the surface of the substrate 12 between the regions 14 to 16 to permit rapid turnoff of the device.

I make the form of my PNPN device shown in FIGURES 4 to 6 in a maner analogous to that outlined hereinabove in connection with the device of FIGURES 1 to 3. In this form of my invention, however, region 44 surrounds and is spaced from the region 46 and the resistance length 18 is done away with.

The form of my invention shown in FIGURES 7 to 9 is manufactured in a manner analogous to that outlined hereinabove in connection with FIGURES 1 to 6 with the mask openings so shaped as to result in a configuration the equivalent circuit of which is illustrated in FIGURE 9. In operation of the device shown in FIGURE 9 the diodes 114 and 124 perform both an injection function and a protective function. Interconnections, shown in FIGURE 9 as being necessary to complete the circuit, may be made on top of an oxide insulating layer in the device of FIGURES 7 and 8.

As will readily be appreciated by those skilled in the art, all regions I have shown as being of n-type conductivity may be made of p-type conductivity and all regions shown as p-type conductivity may be n-type conductivity, with corresponding changes in the specific equivalent circuits shown and in the specific procedures described. Moreover, rather than using aluminum for the ohmic contacts, I may employ platium followed by gold to avoid $n^+$ regions required for aluminum contacts.

It will be seen that I have accompuished the objects of my invention. I have provided a PNPN structure which is planar in nature. All of the contacts to my device can be made at one face or surface of the structure. My structure readily lends itself to manufacture by diffusion processes and is especially adapted to incorporation in integrated circuits.

It will be understood that certain features and subcombination are of utility and may be employed without reference to other features and subcombinations. This is contemplated by and is within the scope of my claims. It is further obvious that various changes may be made in details within the scope of my claims without departing from the spirit of my invention. It is, therefore, to be understood that my invention is not to be limited to the specific details shown and described.

Having thus described my invention, what I claim is:

1. A PNPN device including a body of semiconductor material of one conductivity type, said body having a planar surface and comprising side-by-side relatively adjacent first and second regions of the opposite conductivity type forming PN-junctions in said body with respective continuous edges thereof exposed at said surface, a third region of said one conductivity type disposed within said first region and forming a PN-junction spaced from the PN-junction defining the first region and having a continuous edge exposed at said surface, said third, first and second regions, together with the adjacent portion of said body forming a PNPN diode, and a resistance region of the opposite conductivity type in said surface connecting said first and second regions.

2. An integrated amplifier stage including a body of semiconductor material of one conductivity type, said body having a planar surface and comprising side-by-side relatively adjacent first and second regions of the opposite conductivity type forming PN-junctions in said body with respective continuous edges thereof exposed at said surface, a third region of said one conductivity type within said first region and forming a PN-junction spaced from the PN-junction defining the first region and having a continuous edge exposed at said surface, said third, first and second regions, together with the adjacent portion of said body forming a PNPN diode, said body further comprising fourth and fifth regions of the opposite conductivity type forming PN-junctions in said body with respective continuous edges thereof exposed at said surface, a sixth region of said one conductivity type disposed within said fourth region and forming a PN-junction spaced from the PN-junction defining the fourth region and having a continuous edge exposed at said surface, said sixth, fourth and fifth regions, together with the adjacent portion of said body forming a second PNPN diode, a first resistance region of the opposite conductivity type in said surface connecting the first and fifth regions and a second resistance region in said surface connecting the second and fourth regions.

References Cited

UNITED STATES PATENTS

| | | | |
|---|---|---|---|
| 3,141,135 | 7/1964 | Amlinger et al. | 311—235 |
| 3,221,215 | 11/1965 | Osafune | 317—237 |
| 3,254,277 | 5/1966 | Aarous | 317—235 |
| 2,877,359 | 3/1959 | Ross | 317—235 X |
| 3,243,602 | 3/1966 | Storm | 317—235 X |
| 3,309,537 | 3/1967 | Archer | 317—235 X |

OTHER REFERENCES

Electronics I, Aug. 10, 1964, pp. 66–73; an article entitled: Helpful Transistor Analog: 4-Layer PNPN≈2 Transistors.

JAMES D. KALLAM, Primary Examiner

U.S. Cl. X.R.

29—576